US009007851B2

United States Patent
Chen et al.

(10) Patent No.: US 9,007,851 B2
(45) Date of Patent: Apr. 14, 2015

(54) MEMORY READ TECHNIQUES USING MILLER CAPACITANCE DECOUPLING CIRCUIT

(71) Applicant: Taiwan Semiconductor Manufacturing Co., Ltd., Hsin-Chu (TW)

(72) Inventors: Chien-Yuan Chen, Taichung (TW); Hau-Tai Shieh, Hsinchu (TW); Yi-Tzu Chen, Hsinchu (TW); Hong-Chen Cheng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 59 days.

(21) Appl. No.: 13/753,609

(22) Filed: Jan. 30, 2013

(65) Prior Publication Data

US 2014/0211570 A1 Jul. 31, 2014

(51) Int. Cl.
- *G11C 7/10* (2006.01)
- *H03F 3/16* (2006.01)
- *G11C 7/06* (2006.01)
- *G11C 11/419* (2006.01)

(52) U.S. Cl.
CPC *H03F 3/16* (2013.01); *G11C 7/065* (2013.01); *G11C 7/1048* (2013.01); *G11C 11/419* (2013.01); *G11C 2207/002* (2013.01)

(58) Field of Classification Search
USPC .................................................. 365/189.05
See application file for complete search history.

(56) References Cited

U.S. PATENT DOCUMENTS

| | | | |
|---|---|---|---|
| 7,259,614 B1 * | 8/2007 | Baker et al. | 327/538 |
| 2004/0116160 A1 * | 6/2004 | Deas et al. | 455/570 |

\* cited by examiner

*Primary Examiner* — Anthan Tran
(74) *Attorney, Agent, or Firm* — Eschweiler & Associates, LLC

(57) ABSTRACT

Some embodiments relate to a sense amplifier output buffer configured to buffer an output of a sense amplifier. The sense amplifier output buffer includes a first pull-up element having a source coupled to a first DC supply terminal and having a drain coupled to an output terminal of the sense amplifier output buffer. A first pull-down element is in series with the first pull-up element and has a source coupled to a second DC supply terminal and has a drain coupled to the output terminal. A miller capacitance decoupling circuit is coupled between the drain of the first pull-up element and the drain of the first pull-down element. The miller capacitance decoupling circuit is configured to decouple miller capacitance associated with the drains of the pull-up and pull-down elements from the output terminal. Other embodiments are also disclosed.

20 Claims, 6 Drawing Sheets

US 9,007,851 B2

MEMORY READ TECHNIQUES USING MILLER CAPACITANCE DECOUPLING CIRCUIT

BACKGROUND

Several trends presently exist in the semiconductor and electronics industry. One trend is that recent generations of portable electronic devices are using more memory than previous generations. This increase in memory allows these new devices to store more data, such as music or images, and also may provide the devices with more computational power and speed, relative to previous product generations.

DETAILED DESCRIPTION

Figure 1:
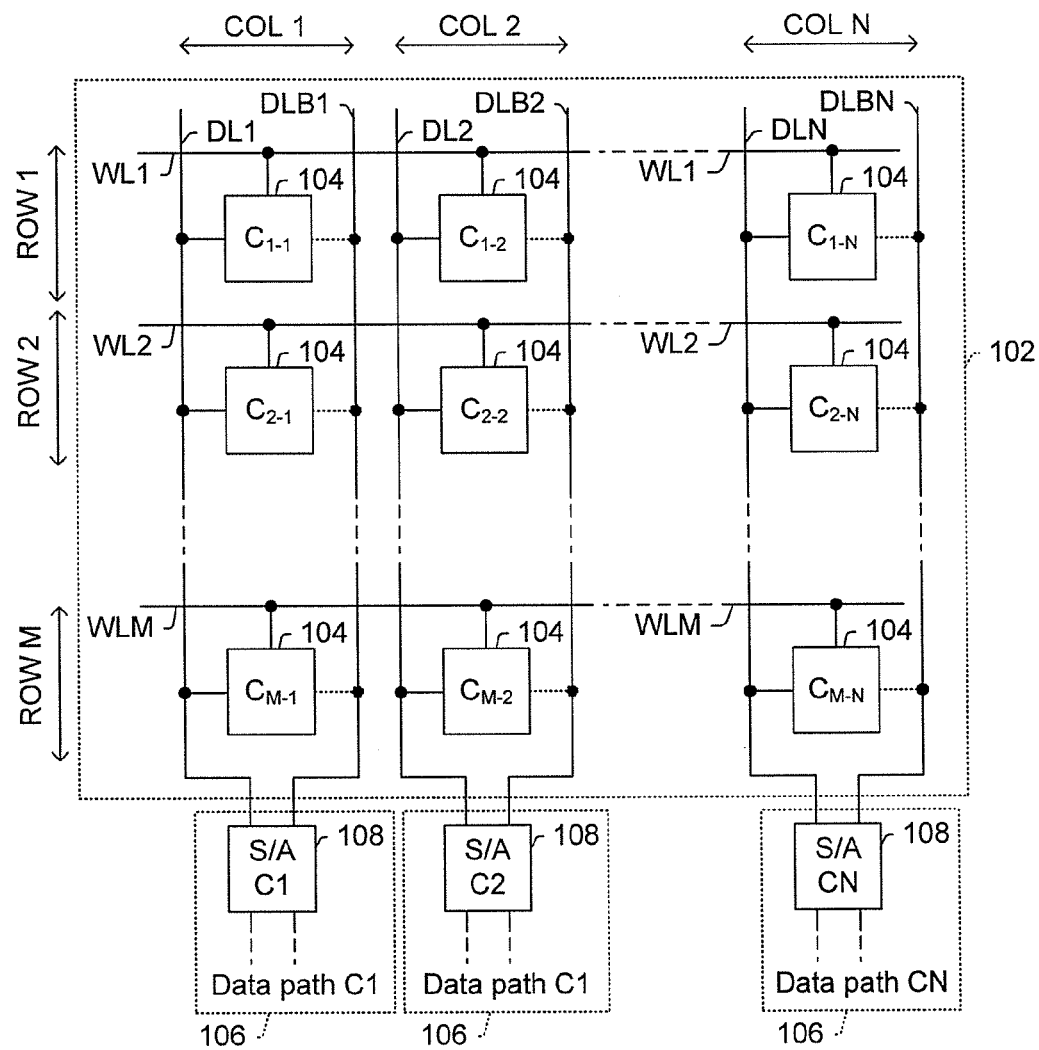
FIG. 1 shows some embodiments of a memory device including an array of memory cells and data paths to read data from cells along columns of the array.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

Semiconductor memory devices typically include an array of memory cells, wherein each memory cell includes a data storage element to store one or more bits of data. To discern between data states stored in the individual memory cells, sense amplifiers are also included in these memory devices. Conventional sense amplifiers suffer from a shortcoming in that they exhibit a Miller capacitance that can lead to slower read operations than desired and/or "bad" read operations where incorrect data states are read from accessed memory cells. To limit the adverse effects due to this Miller capacitance, the memory devices set forth herein make use of Miller capacitance decoupling circuits. As will be appreciated in greater detail below, these Miller capacitance decoupling circuits can decrease read times (e.g., provide faster read operations and hence, more data throughput) and also improve the accuracy of read operations relative to conventional approaches.

FIG. 1 illustrates some embodiments of a semiconductor memory device 100. The memory device 100 includes a memory array 102, which is made up of a plurality of memory cells 104 arranged in M rows and N columns. For clarity, the individual memory cells 104 in FIG. 1 are labeled $C_{row-column}$. Wordlines are coupled to cells along respective rows, and data lines are coupled to cells along respective columns. For example, wordline WL1 is coupled to cells $C_{1-1}$ through $C_{1-N}$ along Row 1, and complementary data lines DL1/DLB1 are coupled to cells $C_{1-1}$ through $C_{M-1}$ along Col. 1. To discern between two or more data states stored in the individual memory cells, data paths 106, which include corresponding sense amplifiers 108, are coupled to columns of memory cells.

Although FIG. 1 shows an embodiment where each column has a separate data path and a corresponding sense amp to read data states from that column, in other embodiments a data path and its corresponding sense amp can be shared (e.g., multiplexed) between multiple columns of memory cells rather than being devoted to a single column of memory cells.

Figure 2:
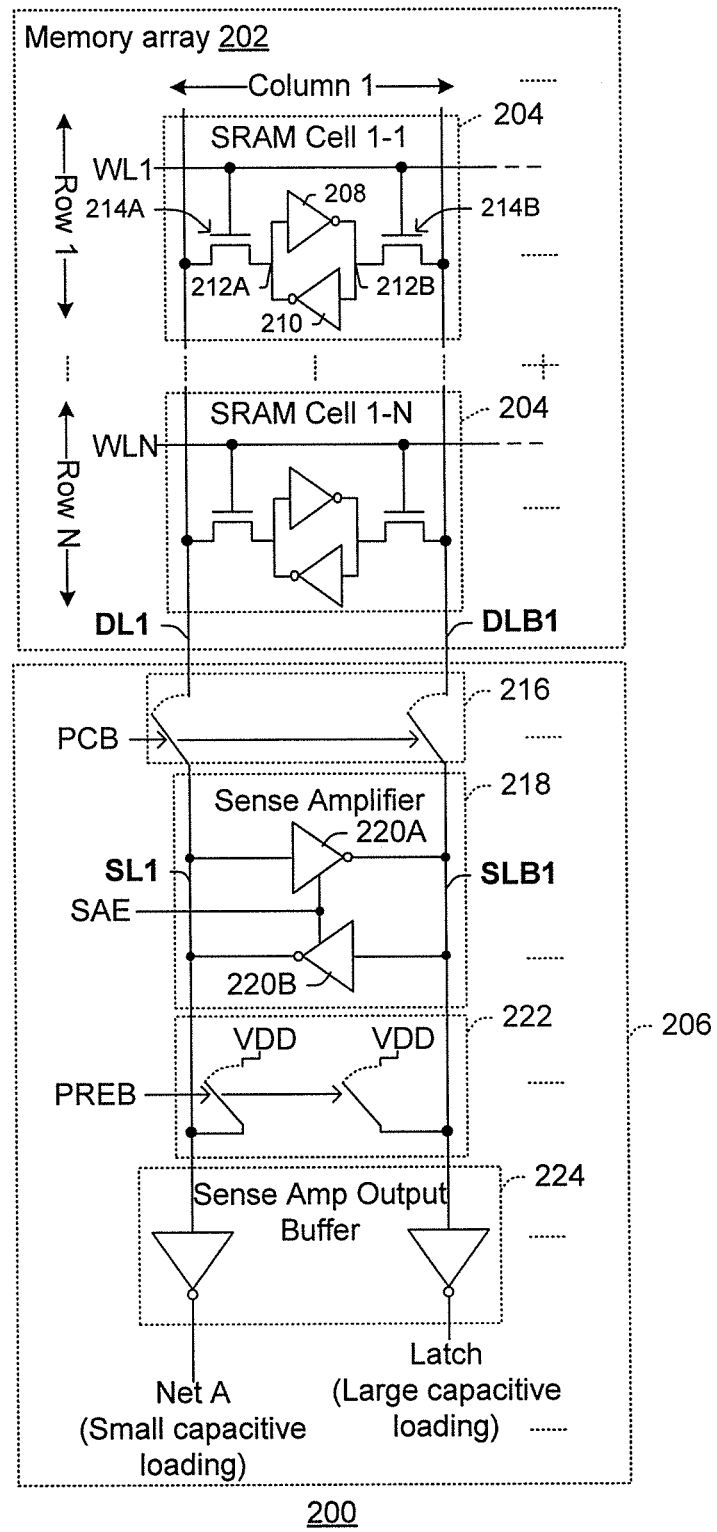
FIG. 2 shows some embodiments of a column of a memory array and a corresponding data path in the context of a static random access memory (SRAM) memory cell.

FIG. 2 shows a more detailed example of a column 200 (e.g., col. 1 of FIG. 1), which includes memory cells 204 and a corresponding data path 206. For illustration, the memory cells 204 in this example are shown as SRAM memory cells, which each include a pair of cross-coupled inverters 208, 210 that cooperatively store a data state in complementary storage nodes 212A, 212B. Access transistors (214A, 214B) within each SRAM cell 204 selectively couple that cell's storage nodes (212A, 212B) to complementary data lines (DL1, DLB1, respectively) based on a wordline voltage level. For example, if WL1 is driven to a logical "1", access transistors 214A, 214B of Cell 1-1 are in low resistance states, thereby coupling the storage nodes 212A, 212B to data lines DL1, DLB1, respectively. Switching element 216, which is under direction of signal PCB, selectively couples datalines DL1, DLB1 to sense amp 218. The sense amp 218 includes cross-coupled sense amp inverters 220A, 220B that sense a data state present on sensing nodes SL1, SLB1. A pre-charge circuit 222 and a sense amp output buffer 224 are also included in data path 206.

To read a data value from a memory cell (e.g., Cell1-1), the data lines DL1/DLB1 are first decoupled from sense amp 218 by opening switch 216. The wordline WL1 is then driven to a logical "1", thereby putting access transistors 214A, 214B into low-resistance states and causing the cross-coupled SRAM inverters 208, 210 to establish a voltage differential, which corresponds to the data state stored in Cell 1-1, between complementary data lines DL1, DLB1. The wordline WL1 can then be de-asserted, so the data lines DL1/DLB1 are floating, albeit with the voltage differential due to the data state from Cell 1-1 remaining thereon.

While switch 216 is open (and datalines DL1/DLB1 are de-coupled from sensing nodes SL1, SLB1), PREB is briefly asserted to briefly close switches of pre-charge circuit 222 and leak some pre-determined amount of charge from supply voltage VDD onto the sensing nodes SL1, SLB1. This pre-charged condition often represents a condition where cross-coupled sense amp inverters 220A, 220B amp are "balanced", meaning that neither sense amp inverter is strongly pulling towards a "0" or "1" state. After the sensing nodes SL1, SLB1 have been pre-charged and "balanced" in this way, switch 216 is closed, causing the voltage differential established on data lines DL1/DLB1 to leak onto the sense lines SL1, SLB1. This "tweaks" the pre-charged condition and changes the voltage differential on the sense lines SL1, SLB1, thereby causing the cross-coupled sense amp inverters 220A, 220B to pull one way or another depending on the data state read from Cell 1-1—ultimately resulting in the cross-coupled sense amp inverters 220A, 220B mutually reinforcing the sensed data state. The sense amp output buffer 224 then amplifies the sensed data state and drives the sensed state to a latch coupled to SLB1. The inventors have appreciated that the sense amp output buffers 224, however, have an undesirable Miller capacitance in some configurations. This undesirable Miller capacitance can cause slow and/or inaccurate read operations.

Figure 3:
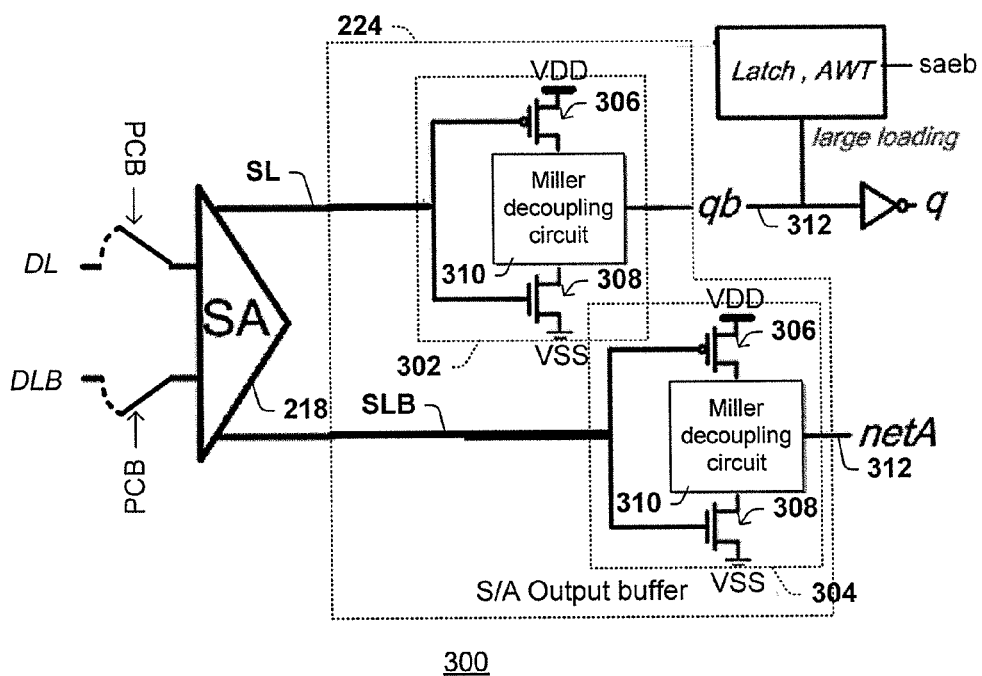
FIG. 3 shows some embodiments of a sense amp output buffer made up of first and second inverters that each include a Miller capacitance decoupling circuit.

To limit the effects of this Miller capacitance, FIG. 3 shows some embodiments of a data path 300 where at least one Miller capacitance decoupling circuit is included in the sense amp output buffer 224. As shown, the sense amplifier output buffer 224 includes first and second inverters 302, 304, which are arranged on the sensing nodes SL, SLB. Each of these inverters 302, 304 includes a first pull-up element 306, a first pull down element 308, and a Miller capacitance decoupling circuit 310. The first pull-up element 306 has a source coupled to a first DC supply terminal (e.g., VDD) and a drain coupled to an output terminal 312 of the sense amplifier output buffer. The first pull-down element 308 is in series with the first pull-up element 306 and has a source coupled to a second DC supply terminal (e.g., VSS) and a drain coupled to the output terminal 312. The miller capacitance decoupling circuit 310 is coupled between the drain of the first pull-up element 306 and the drain of the first pull-down element 308. The miller capacitance decoupling circuit 310 is configured to decouple miller capacitance associated with the drains of the pull-up and pull-down elements 306, 308 from the output terminal 312.

Figure 4:
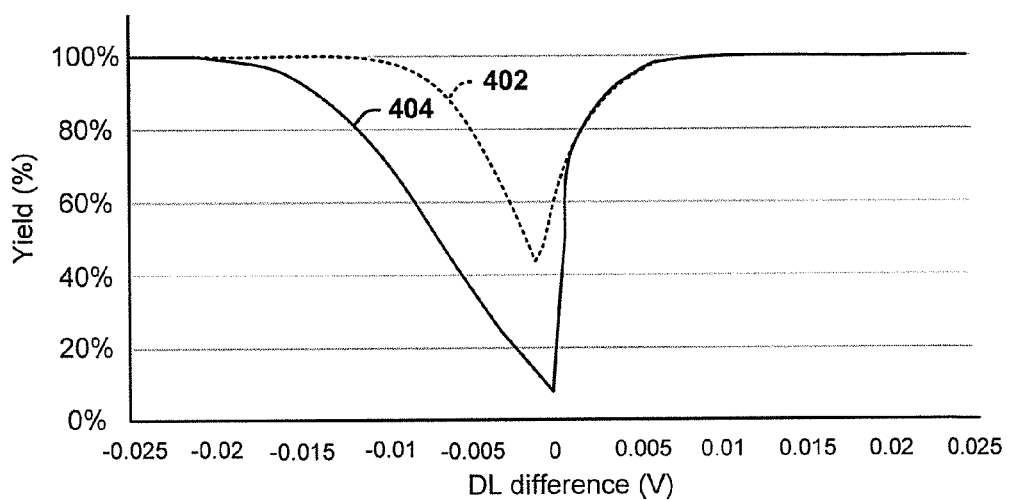
FIG. 4 shows a graph illustrating how some embodiments using a Miller capacitance decoupling circuit can improve accuracy of read operations relative to a conventional approach.

FIG. 4 is a chart illustrating how some embodiments of the Miller decoupling circuits improve read accuracy relative to some conventional approaches. In particular, FIG. 4 illustrates a first curve 402 showing read operations for some embodiments using Miller decoupling circuits as well as a second curve 404 showing read operations without Miller decoupling circuits in place. As shown, when there is a sufficiently large voltage bias between data lines DL, DLB (as indicated on the x-axis), the corresponding percentage read yield when correct data is read from a cell (as indicated on the y-axis) is at or near 100%. For example, both the first and second curves 402, 404 provide correct data reads at substantially 100% of the time when the voltage bias between the data lines DL, DLB is less than −0.02 V or is greater than 0.01 V. However, as illustrated by the second curve 404, when Miller decoupling circuits are not included in the output buffer of the sense amp, the sense amp can have difficulty discerning between read data states when the voltage bias between data lines DL, DLB is between 0.005 V and −0.02 V. As shown by the first curve 402, the use of a Miller decoupling circuit in the sense amp output buffer significantly improves read accuracy for small voltage biases between data lines DL, DLB.

Figure 5:
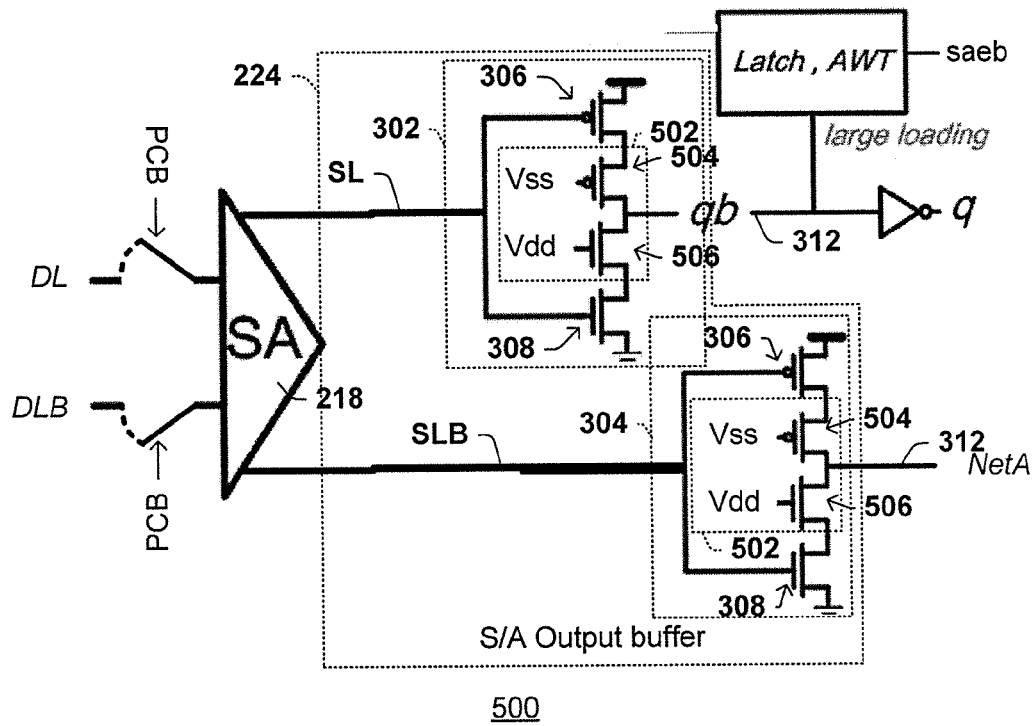
FIG. 5 shows some embodiments of a sense amp output buffer made up of first and second inverters that each include a Miller capacitance decoupling circuit.
Figure 6:
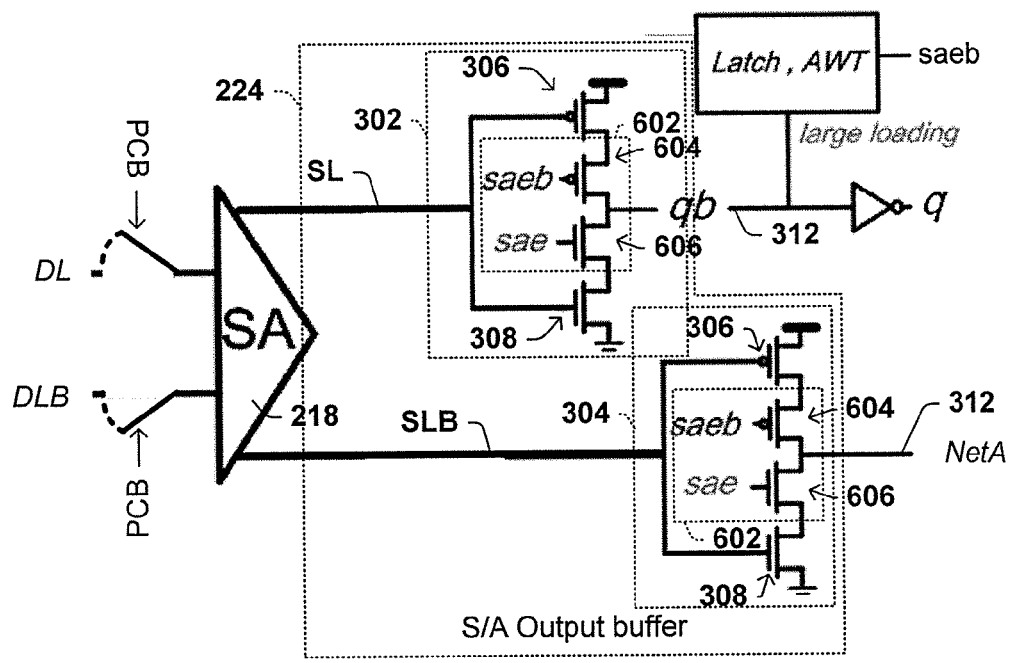
FIG. 6 shows some embodiments of a sense amp output buffer made up of first and second inverters that each include a Miller capacitance decoupling circuit.
Figure 7:
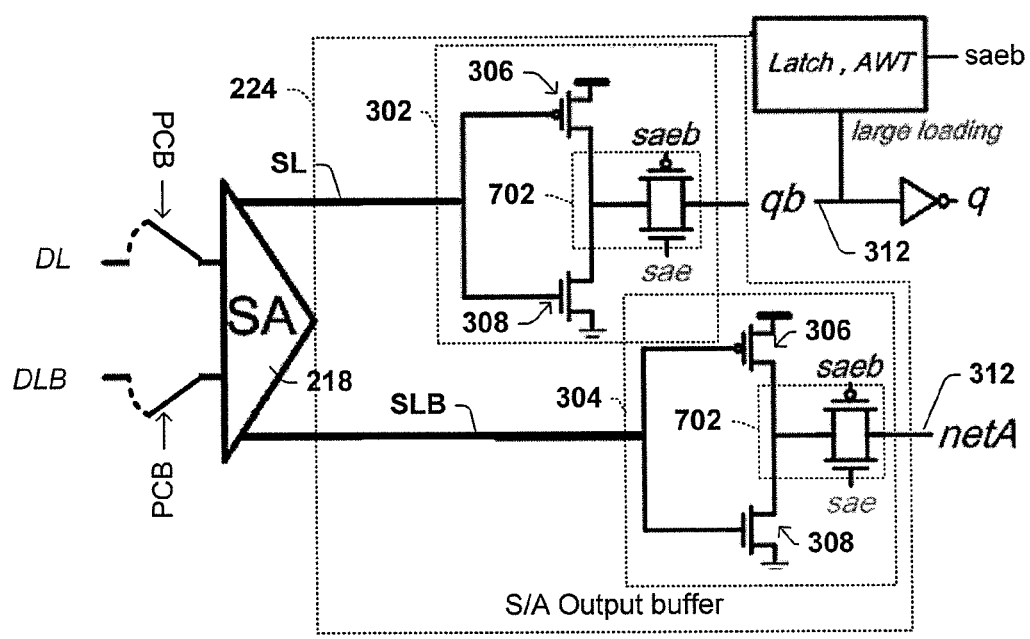
FIG. 7 shows some embodiments of a sense amp output buffer made up of first and second inverters that each include a Miller capacitance decoupling circuit.

Turning now to FIGS. 5-7, one can see several more detailed embodiments for implementing Miller capacitance decoupling circuits. FIG. 5 shows some embodiments of a data path 500 in which the sense amplifier output buffer 224 again includes first and second inverters 302, 304. Each of these inverters 302, 304 includes a first pull-up element 306, a first pull down element 308, and a Miller capacitance decoupling circuit 502. In this example, the Miller capacitance decoupling circuit 502 includes a second pull-up element 504 coupled between the drain of the first pull-up element 306 and the output terminal 312; and also includes a second pull-down element 506 coupled between the drain of the first pull-down element 308 and the output terminal 312. A control terminal of the second pull-up element 504 is coupled to a second DC supply voltage (e.g., VSS) to put the second pull-up element 504 in a relatively constant low resistance state. A control terminal of the second pull-down element 506 is coupled to a first DC supply voltage (e.g., VDD) to put the second pull-down element 506 in a relatively constant low resistance state. These second pull-up and pull-down elements 504, 506 decouple Miller capacitance associated with the drains of the first pull-up and pull-down elements 306, 308 from the output terminal 312, thereby helping to improve performance of the sense amp output buffer 224.

FIG. 6 shows some embodiments of a data path 600 where the sense amplifier output buffer 224 again includes first and second inverters 302, 304. Each of these inverters 302, 304 includes a first pull-up element 306, a first pull down element 308, and a Miller capacitance decoupling circuit 602. In this example, the Miller capacitance decoupling circuit 602 includes a second pull-up element 604 coupled between the drain of the first pull-up element 306 and the output terminal 312; and also includes a second pull-down element 606 coupled between the drain of the first pull-down element 308 and the output terminal 312. A control terminal of the second pull-down element 606 is coupled to sense amp enable (SAEB) signal (see also SAE in FIG. 2), and the control terminal of the second pull-up element 604 is coupled to an inverted version of SAE (namely SAEB). In this embodiment, the second pull-up and pull-down elements 604, 606 are only in low resistance states when the SAE signal is driven to a logical "1", and are in high-resistance states otherwise. The embodiment of FIG. 6 may exhibit lower power consumption because the second pull-up and second pull-down elements 604, 606 being in high-resistance states stops current flow from VDD to VSS, except for when SAE is in a logical "1" state (i.e., when sense amp is enabled).

FIG. 7 shows some embodiments of a data path 700 where the sense amplifier output buffer 224 again includes first and second inverters 302, 304. Each of these inverters 302, 304 includes a first pull-up element 306, a first pull down element 308, and a Miller capacitance decoupling circuit 702. In this example, the Miller capacitance decoupling circuit 702 includes a transmission gate having a transmission gate output terminal coupled to the output terminal. The transmission gate includes an n-type metal oxide semiconductor (NMOS) transistor whose gate receives the sense amp enable (SAE) signal, and a p-type metal oxide semiconductor (PMOS) transistor whose gate receives an inverted version of SAE (i.e., SAEB).

Although embodiments of the invention have been illustrated and described with respect to one or more implementations, equivalent alterations and modifications will occur to others skilled in the art upon the reading and understanding of this specification and the annexed drawings. For example, although some embodiments have been described above with regards to static random access memory (SRAM) cells, it will be appreciated that this disclosure is not limited to SRAM memory cells but is applicable to any type of memory cell wherein sense amps are used to discern a data state stored therein. For example, the Miller capacitance decoupling concepts can be used for flash memory, ferroelectric memory, dynamic random access memory (DRAM), resistive memory, and phase change memory, among others. Further, although a pair of complimentary data lines (e.g., DL1 and DL1B) have been illustrated and discussed as coupling a column of SRAM memory cells to a corresponding sense amp with regards to FIG. 1, in other embodiments such as in a dynamic random access memory (DRAM) for example, only a single data line couples a given memory cell to a corresponding sense amp. When complementary data lines are used, as in SRAM for example, the sense amp detects a voltage difference between the complimentary data lines and determines a corresponding data state which was stored in an accessed cell of the column. In contrast, when only a single data line is coupled to the memory cell, such as in a dynamic random access memory (DRAM) for example, the sense amp can compare the signal on the single data line with a reference data line (which carries a predetermined reference signal) to determine a data state stored in an accessed cell of the column.

Further, although some embodiments have been illustrated and described above as using n-type transistors (e.g., NMOS transistors) or p-type transistors (e.g., PMOS transistors), it will be appreciated that the conductivity types of these transistors can be "flipped" in other embodiments. For example, the illustrated n-type transistors can be implemented as p-type transistors (and vice versa), provided the corresponding biases are also flipped. Additionally although MOS-type transistors are shown, other transistors such as BJTs or HEMT-devices, among others could be used in place of the MOS-type devices.

Figure 8:
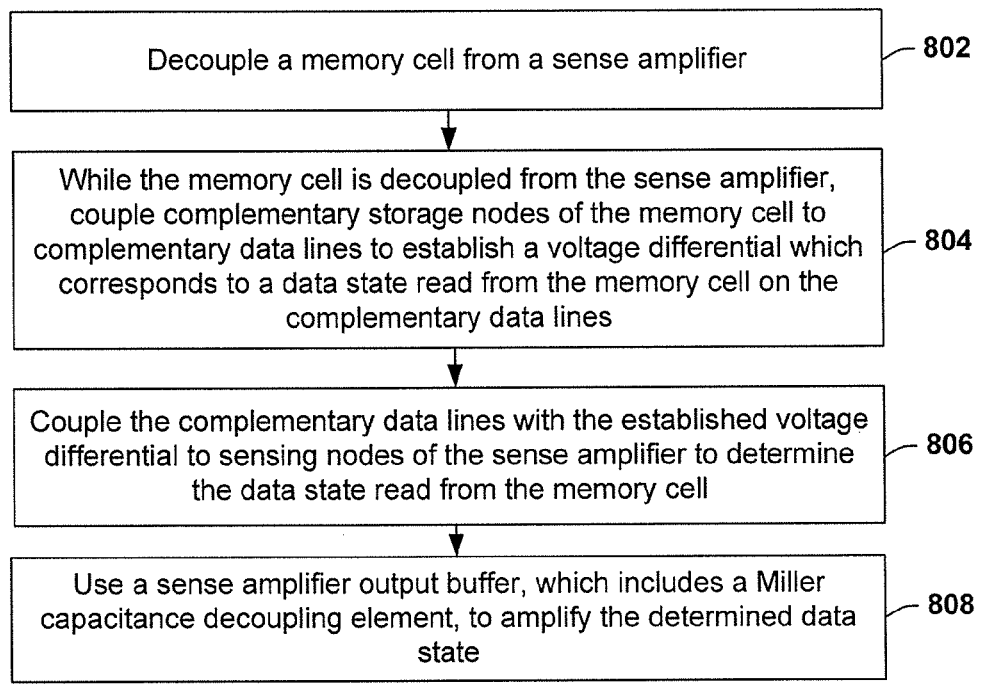
FIG. 8 shows some embodiments of a method of reading data from a memory device that uses a Miller capacitance decoupling circuit.

FIG. 8 shows a flow chart for one method 800 that relates to various embodiments of the present invention. Notably, while the methods illustrated herein are illustrated and described as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory device which are illustrated and described herein (e.g., column of memory device in FIG. 2) as well as in association with other systems not illustrated, wherein all such implementations are contemplated as falling within the scope of the present invention and the appended claims.

In 802, a memory cell is decoupled from a sense amplifier.

In 804, while the memory cell is decoupled from the sense amplifier, complementary storage nodes of the memory cell are accessed to establish a voltage differential on complementary data lines coupled to the memory cell. The established voltage differential corresponds to a data state read from the memory cell.

In 806, the complementary data lines with the established voltage differential are then coupled to sensing nodes of a sense amplifier to determine the data state read from the memory cell.

In 808, a sense amplifier output buffer, which includes a Miller capacitance decoupling circuit, is then used to amplify the determined data state.

Some embodiments relate to a sense amplifier output buffer configured to buffer an output of a sense amplifier. The sense amplifier output buffer includes a first pull-up element having a source coupled to a first DC supply terminal and having a drain coupled to an output terminal of the sense amplifier output buffer. A first pull-down element is in series with the first pull-up element and has a source coupled to a second DC supply terminal and has a drain coupled to the output terminal. A miller capacitance decoupling circuit is coupled between the drain of the first pull-up element and the drain of the first pull-down element. The miller capacitance decoupling circuit is configured to decouple miller capacitance associated with the drains of the pull-up and pull-down elements from the output terminal.

Other embodiments relate to a memory device that includes a sense amplifier and a sense amplifier output buffer. The sense amplifier includes a pair of cross-coupled inverters which establish first and second sensing nodes at which the pair of cross-coupled inverters cooperatively reinforce a data state read from a memory cell. The sense amplifier output buffer includes a first output buffer inverter having an input terminal coupled to the first sensing node and a second output buffer inverter having an input terminal coupled to the second sensing node. At least one of the first and second output buffer inverters includes a current path having a first pull-up element arranged in series with a first pull-down element, wherein an output node of the sense amplifier output buffer is arranged between a drain of the first pull-up element and a drain of the first pull-down element. A miller capacitance decoupling circuit is arranged between the drain of the pull-up element and the drain of the pull-down element.

Another embodiment relates to a method of sensing data from a memory cell. In this method, a memory cell is decoupled from a sense amplifier. While the memory cell is decoupled from the sense amplifier, complementary storage nodes of the memory cell are accessed to establish a voltage differential on complementary data lines coupled to the memory cell. The established voltage differential corresponds to a data state read from the memory cell. The complementary data lines with the established voltage differential are then coupled to sensing nodes of a sense amplifier to determine the data state read from the memory cell. A sense amplifier output buffer, which includes a Miller capacitance decoupling circuit, is then used to amplify the determined data state.

In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A sense amplifier output buffer configured to buffer an output of a sense amplifier, the sense amplifier output buffer comprising:
   a first pull-up element having a source coupled to a first DC supply terminal and a drain coupled to an output terminal of the sense amplifier output buffer;
   a first pull-down element in series with the first pull-up element and having a source coupled to a second DC supply terminal and a drain coupled to the output terminal; and
   a Miller capacitance decoupling circuit coupled between the drain of the first pull-up element and the drain of the first pull-down element, wherein the miller capacitance decoupling circuit is configured to decouple Miller capacitance associated with the drains of the pull-up and pull-down elements from the output terminal;

wherein control terminals of the first pull-up element and the first pull-down element are coupled to the output of the sense amplifier.

2. The sense amplifier output buffer of claim 1, wherein the Miller capacitance decoupling circuit includes a second pull-up element arranged between the drain of the first pull-up element and the output terminal.

3. The sense amplifier output buffer of claim 2:

wherein a control terminal of the second pull-up element is coupled to a DC supply voltage that is constant over time.

4. The sense amplifier output buffer of claim 2:

wherein a control terminal of the second pull-up element is controlled based on a sense amp enable control signal.

5. The sense amplifier output buffer of claim 2, wherein the Miller capacitance decoupling circuit includes a second pull-down element arranged between the drain of the first pull-down element and the output terminal.

6. The sense amplifier output buffer of claim 5:

wherein control terminals of the second pull-up and pull-down elements are coupled to DC supply voltages that are constant over time.

7. The sense amplifier output buffer of claim 5:

wherein control terminals of the second pull-up and pull-down elements are controlled based on a sense amp enable control signal.

8. The sense amplifier output buffer of claim 1, wherein the Miller capacitance decoupling circuit includes a transmission gate having a transmission gate output terminal coupled to the output terminal.

9. The sense amplifier output buffer of claim 8, wherein control terminals of the transmission gate are controlled based on a sense amp enable control signal.

10. The sense amplifier output buffer of claim 1, wherein the pull-up element is a p-type metal oxide semiconductor (PMOS) transistor and wherein the pull-down element is an n-type metal oxide semiconductor (NMOS) transistor.

11. A memory device, comprising:

a sense amplifier including a pair of cross-coupled inverters which establish first and second sensing nodes at which the pair of cross-coupled inverters cooperatively reinforce a data state read from a memory cell; and a sense amplifier output buffer including a first output buffer inverter having an input terminal coupled to the first sensing node and a second output buffer inverter having an input terminal coupled to the second sensing node;

wherein at least one of the first and second output buffer inverters include a current path having a first pull-up element arranged in series with a first pull-down element with an output node arranged between a drain of the first pull-up element and a drain of the first pull-down element, wherein a Miller capacitance decoupling circuit is arranged between the drain of the pull-up element and the drain of the pull-down element.

12. The memory device of claim 11, wherein the first output buffer inverter has an output node coupled to a latch element having a first capacitive loading and wherein the second output buffer inverter has an output node having a second capacitive loading, the second capacitive loading being less than the first capacitive loading.

13. The memory device of claim 11, wherein the Miller capacitance decoupling circuit comprises:

a second pull-up element arranged between the drain of the first pull-up element and the output node; and a second pull-down element in series with the second pull-up element and arranged between the drain of the first pull-down element and the output node.

14. The memory device of claim 11, wherein control terminals of the first pull-up element and the first pull-down element are both coupled to the first or second sensing node of the sense amplifier.

15. The memory device of claim 13, wherein a control terminal of at least one of the second pull-up element or the second pull-down element is coupled to a DC supply voltage that is constant over time.

16. The memory device of claim 13, wherein a control terminal of the second pull-up element is controlled based on a sense amp enable control signal.

17. The memory device of claim 14, wherein the Miller capacitance decoupling circuit includes a transmission gate having a transmission gate input terminal coupled to the output node, and wherein control terminals of the transmission gate are controlled based on a sense amp enable control signal.

18. A method of sensing data from a memory cell, comprising:

decoupling a memory cell from a sense amplifier;

while the memory cell is decoupled from the sense amplifier, accessing complementary storage nodes of the memory cell to establish a voltage differential on complementary data lines, where the established voltage differential corresponds to a data state read from the memory cell;

coupling the complementary data lines with the established voltage differential to sensing nodes of a sense amplifier to determine the data state read from the memory cell; and using a sense amplifier output buffer, which includes a Miller capacitance decoupling circuit, to amplify the determined data state.

19. The method of claim 18, wherein the sense amplifier output buffer comprises:

a first pull-up element having a source coupled to a first DC supply terminal and a drain coupled to an output terminal of the sense amplifier output buffer; and a first pull-down element in series with the first pull-up element and having a source coupled to a second DC supply terminal and a drain coupled to the output terminal;

wherein the Miller capacitance decoupling circuit is coupled between the drain of the first pull-up element and the drain of the first pull-down element, wherein the Miller capacitance decoupling circuit is configured to decouple Miller capacitance associated with the drains of the pull-up and pull-down elements from the output terminal.

20. The method of claim 19, wherein the Miller capacitance decoupling circuit decouples the Miller capacitance based on a sense amp enable signal.

* * * * *